US009219256B2

(12) United States Patent  (10) Patent No.: US 9,219,256 B2
Hsieh  (45) Date of Patent: Dec. 22, 2015

(54) HANDLING DEVICE AND HANDLING METHOD THEREOF

(71) Applicant: AU OPTRONICS CORP., Hsin-Chu (TW)

(72) Inventor: Wei-Jung Hsieh, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 22 days.

(21) Appl. No.: 14/456,185

(22) Filed: Aug. 11, 2014

(65) Prior Publication Data

US 2015/0295206 A1    Oct. 15, 2015

(30) Foreign Application Priority Data

Apr. 15, 2014  (TW) .............................. 103113746 A

(51) Int. Cl.
  *B66F 19/00*  (2006.01)
  *H01L 51/56*  (2006.01)
  *B25J 15/00*  (2006.01)
(52) U.S. Cl.
  CPC .............. *H01L 51/56* (2013.01); *B25J 15/008* (2013.01)
(58) Field of Classification Search
  CPC ...... H01L 51/56; B25J 15/008; B25J 15/0666
  USPC ................... 294/212, 213; 414/941
  See application file for complete search history.

(56) References Cited

U.S. PATENT DOCUMENTS

| 6,517,130 | B1 * | 2/2003 | Donoso | B25J 15/0616 |
| | | | | 294/185 |
| 7,044,521 | B2 * | 5/2006 | Tokunaga | H01L 21/6838 |
| | | | | 294/183 |
| 7,909,374 | B2 * | 3/2011 | Thallner | H01L 21/6838 |
| | | | | 294/212 |
| 8,703,583 | B2 * | 4/2014 | Maki | H01L 21/67092 |
| | | | | 257/E21.237 |
| 2005/0180088 | A1 | 8/2005 | Chiang et al. | |
| 2011/0308739 | A1 * | 12/2011 | McCutcheon | H01L 21/187 |
| | | | | 156/766 |
| 2012/0114456 | A1 * | 5/2012 | Musha | H01L 21/67742 |
| | | | | 414/751.1 |
| 2014/0054184 | A1 * | 2/2014 | Becker | A01C 7/02 |
| | | | | 206/216 |
| 2015/0050114 | A1 * | 2/2015 | Conroy | A45C 11/182 |
| | | | | 414/800 |
| 2015/0287626 | A1 * | 10/2015 | Arai | H01L 21/683 |
| | | | | 414/805 |

FOREIGN PATENT DOCUMENTS

TW  201021092  6/2010
TW  I394900    1/2011

* cited by examiner

*Primary Examiner* — Gabriela Puig
(74) *Attorney, Agent, or Firm* — WPAT, PC; Justin King

(57) ABSTRACT

A handling device is used for handling a substrate. The handling device includes a holder, a moving element, at least one first adhesive chuck, and at least one second adhesive chuck. The moving element is located adjacent to the holder for moving relative to the holder along a first axial direction. The first adhesive chuck is located on a first surface of the holder and the second adhesive chuck is located on a first surface of the moving element, in which the first adhesive chuck and the second adhesive chuck are used to be respectively separated from the substrate adhered thereon. In addition, another embodiment of the invention discloses a handing method of the handing device.

20 Claims, 9 Drawing Sheets

HANDLING DEVICE AND HANDLING METHOD THEREOF

RELATED APPLICATIONS

This application claims priority to Taiwan Application Serial Number 103113746, filed Apr. 15, 2014, which is herein incorporated by reference.

FIELD OF THE INVENTION

The invention relates to a handling device and a handling method thereof, and more particularly to a handling device for handling a substrate and a handling method thereof.

BACKGROUND OF THE INVENTION

Recently, a panel display technology weeds through the old to bring forth the new. For example, an organic light emitting diode (OLED) also called an "organic electroluminescence (OEL)" is one kind of the panel display technology, in which the OLED has several advantages such as electricity saving, thin thickness, light weight, widely viewing angle, fast responding time, high photoelectric transformation efficiency, without backlight structure and color filters, high color contrast, high luminance, widely using temperature range and so on. Therefore, the OLED is considered as a promising technique of the flat panel display in the future.

During several manufacturing processes of the panel (such as the OLED panel), the evaporated surface of the substrate of the panel must be disposed downward in an evaporating process to prevent dust from adhering on the evaporated surface of the substrate. In other words, the substrate must be hung in a chamber such that the evaporated surface of the substrate may be disposed downward. Therefore, the substrate may be curved owing to an influence of gravity during the evaporating process. In order to protect the substrate form over bending such that a film may be uniformly evaporated on the evaporated surface of the substrate, the substrate has to be carried and transported with an adhesive carrier in a vacuum chamber, but the viscosity of the adhesive carrier is limited so that there is a need of a sucking disc combination disposed with the substrate to strengthen the supporting force for stably carrying with the substrate according to the air pressure difference between inside and outside of the sucking disc combination.

However, the sucking disc combination is not capable of being attached on the substrate in the vacuum chamber because the sucking disc combination need be located in the chamber filled with air to produce suction force according to the air pressure difference between inside and outside thereof, thereby resulting in the dust drifting and adhering on the substrate owing to Brownian motion when the sucking disc combination is attached on the substrate in the chamber filled with the air. Furthermore, the transporting time of the substrate is increased and the manufacturing efficiency of the panel is decreased because the substrate has to be transported to several chambers.

SUMMARY OF THE INVENTION

The invention provides a handling device and a handling method thereof.

According to an embodiment of the invention, a handling device for handling a substrate, the handling device includes a holder, a movable element, at least one first adhesive chuck, and at least one second adhesive chuck. The movable element is located adjacent to the holder for moving relative to the holder along a first axial direction. The first adhesive chuck is located on a first surface of the holder. The second adhesive chuck is located on a first surface of the movable element, in which the first adhesive chuck and the second adhesive chuck are configured to be respectively separated from the substrate adhered thereon.

According to another embodiment disclosed herein, the movable element is configured for moving toward a lateral of the holder facing to the substrate such that the first adhesive chuck is separated from the substrate after the first adhesive chuck and the second adhesive chuck are adhered on the substrate. The movable element is configured for moving away from the substrate to drive the second adhesive chuck such that the second adhesive chuck is separated from the substrate after the first adhesive chuck is separated from the substrate.

According to another embodiment disclosed herein, the handling device further includes a pushing element penetrating through the movable element for pushing the substrate away from the holder such that the first adhesive chuck is separated from the substrate.

According to another embodiment disclosed herein, the movable element includes a recovering element connected to the holder for driving the movable element to jointly move toward the holder such that the second adhesive chuck is separated from the substrate after the first adhesive chuck is separated from the substrate.

According to another embodiment disclosed herein, the movable element is configured to move away from the substrate such that the second adhesive chuck is separated from the substrate after the first adhesive chuck and the second adhesive chuck are adhered on the substrate. The handling device includes a pushing element penetrating through the movable element for pushing the substrate away from the holder such that the first adhesive chuck is separated from the substrate after the second adhesive chuck is separated from the substrate.

According to another embodiment disclosed herein, the movable element includes a recovering element connected to the holder for driving the movable element to jointly move toward a lateral of the holder facing to the first adhesive chuck after the first adhesive chuck is separated from the substrate.

According to another embodiment disclosed herein, a size of the first adhesive chuck is different from a size of the second adhesive chuck.

According to another embodiment disclosed herein, the first adhesive chuck and the second adhesive chuck are spaced at an interval.

According to another embodiment disclosed herein, a handling method includes several steps as follows. A first adhesive chuck located on a first surface of a holder and a second adhesive chuck located on a first surface of a movable element are adhered on a substrate. The first adhesive chuck and the second adhesive chuck are respectively separated from the substrate adhered thereon.

According to another embodiment disclosed herein, the step of respectively separating the first adhesive chuck and the second adhesive chuck from the substrate adhered thereon includes several steps as follows. The movable element is handled to move toward a lateral of the holder facing to the substrate such that the first adhesive chuck is separated from the substrate after the first adhesive chuck and the second adhesive chuck are adhered on the substrate. The movable element is handled to move away from the substrate along a first axial direction to drive the second adhesive chuck such that the second adhesive chuck is separated from the substrate after the first adhesive chuck is separated from the substrate.

According to another embodiment disclosed herein, the handling method further includes steps as follows. A pushing element is handled to penetrate through the movable element for pushing the substrate away from the holder such that the first adhesive chuck is separated from the substrate.

According to another embodiment disclosed herein, the handling method further includes steps as follows. A recovering element is handled to drive the movable element to jointly move toward the holder such that the second adhesive chuck is separated from the substrate.

According to another embodiment disclosed herein, respectively separating the first adhesive chuck and the second adhesive chuck from the substrate adhered thereon includes steps as follows. The movable element is handled to move away from the substrate such that the second adhesive chuck is separated from the substrate after the first adhesive chuck and the second adhesive chuck are adhered on the substrate. A pushing element is handled to penetrate through the movable element to push the substrate away from the holder such that the first adhesive chuck is separated from the substrate.

According to another embodiment disclosed herein, the handling method further includes steps as follows. A recovering element is handled to drive the movable element to jointly move toward a lateral of the holder facing to the first adhesive chuck after the first adhesive chuck is separated from the substrate.

According to another embodiment disclosed herein, respectively separating the first adhesive chuck and the second adhesive chuck from the substrate adhered thereon includes steps as follows. The first adhesive chuck and the second adhesive chuck are adhered on the substrate in a vacuum chamber.

In the embodiment, the handling device can be adhered on the substrate or separated form the substrate in the same vacuum chamber to prevent the dust from drifting in the chamber and adhering on the substrate owing to Brownian motion. Simultaneously, the first adhesive chuck and the second adhesive chuck of the handling device can be jointly adhered on the substrate to strengthen the adhering ability of the handling device to reduce the dropping risk when the substrate is transported by the handling device. In addition, the substrate carried by the handling device is capable of being processed in relative manufacturing processes in only one vacuum chamber. Therefore, there is no need of disposing unnecessary chambers for the relative manufacturing processes such that the cost for disposing the chambers and the time for transporting the substrate in the relative manufacturing processes are capable of being decreased, thereby resulting in the manufacturing efficiency of the panel is capable of being simultaneously increased.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

Figure 1A:
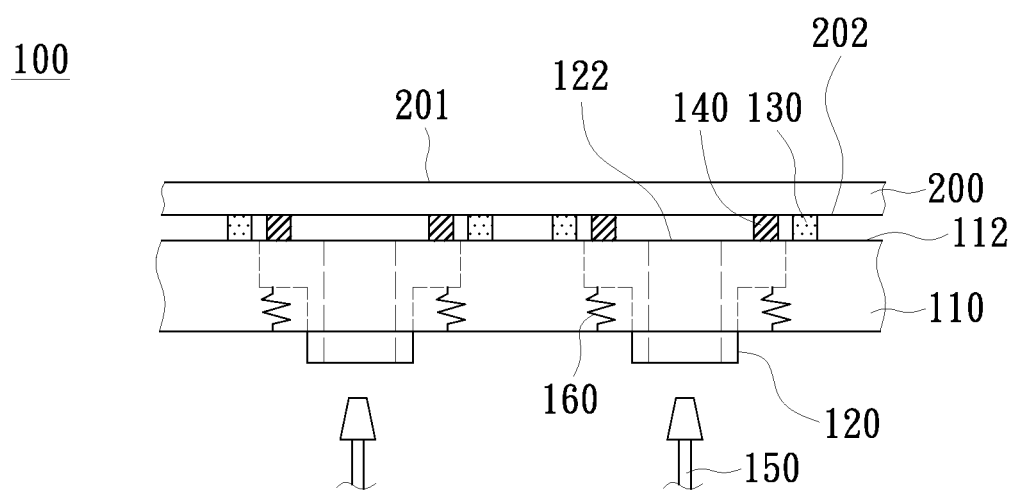
FIGS. 1A~1D are flow diagrams illustrating a handling method in a handling device according to an embodiment of the invention.

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1D are flow diagrams showing a handling method in a handling device 100 according to an embodiment of the invention. As shown in FIGS. 1A~1D, the handling device 100 of the embodiment may be configured to handle a substrate 200, in which the means of handling the substrate 200 includes the means of carrying with the substrate 200 and unloading with the substrate 200. In other words, the handling device 100 may carry with the substrate 200 to a target position, and then the handling device 100 may unload the substrate 200 in the target position during display panel manufacturing processes. In this embodiment, the display panel may be, but not limited to, an organic light-emitting diode (OLED) panel.

The handling device 100 of this embodiment includes a holder 110, a movable element 120, several first adhesive chucks 130, and several second adhesive chucks 140. The movable element 120 is located adjacent to the holder 110 for moving relative to the holder 110 along a first axial direction $D_1$. In this embodiment, the movable element 120 penetrates through the holder 110 and the first axial direction $D_1$ is, but not limited to, vertical to a second surface 202 of the substrate 200. It is noted that the handling device 100 of another embodiment may only include one first adhesive chuck 130 and one second adhesive chuck 140 to be capable of handling the substrate 200.

In this embodiment, the first adhesive chucks 130 are located on a first surface 112 of the holder 110 and the second adhesive chucks 140 are located on a first surface 122 of the movable element 120, in which the first adhesive chucks 130 and the second adhesive chucks 140 are configured to be respectively separated from the substrate 200 adhered thereon. In other words, the first adhesive chucks 130 and the second adhesive chucks 140 are configured to be respectively separated from the substrate 200 at different time. In other words, the first adhesive chucks 130 may be separated from the substrate 200 before the second adhesive chucks 140 are separated from the substrate 200 or the second adhesive chucks 140 may be separated from the substrate 200 before the first adhesive chucks 130 are separated from the substrate 200. In this embodiment, a viscosity of each of the first adhesive chucks 130 and the viscosity of each of the second adhesive chucks 140 are, but not limited to, less than the 0.1 Mpa.

In addition, the second surface 202 of the substrate 200 of the embodiment is opposite to the first surface 122 of the movable element 120 and a first surface 112 of the holder 110. It is noted that the handling method of the handling device 100 of the embodiment discloses as follows.

As shown in FIG. 1A, the first adhesive chucks 130 located on the first surface 112 of the holder 110 and the second adhesive chucks 140 located on the first surface 122 of the movable element 120 are jointly adhered on the substrate 200. For example, the holder 110 and the movable element 120 jointly move adjacent to the second surface 202 of the substrate 200 when the substrate 200 is located in a chamber, and furthering the first adhesive chucks 130 and the second adhesive chucks 140 are jointly adhered on the substrate 200. In another embodiment, the substrate 200 may be transported adjacent to the holder 110 and the movable element 120 by a transporting device (no shown) such that the first adhesive chucks 130 and the second adhesive chucks 140 may be jointly adhered on the substrate 200. The holder 110 and the movable element 120 may jointly drive the substrate 200 to move to a target position or turn over in the target position, and thus the substrate 200 may be processed in display panel manufacturing processes in the target position. For instance, when the substrate 200 is processed to be evaporated with a film, the holder 110 turns over such that the second surface 202 of the substrate 200 adhered on the holder 110 faces upward and a first surface 201 of the substrate 200 adhered on the holder 110 faces downward, and thus the first surface 201 facing downward can be evaporated with the film (no shown) thereon. It is noted that the first surface 201 is, but not limited to, opposite to the second surface 202.

Figure 1B:
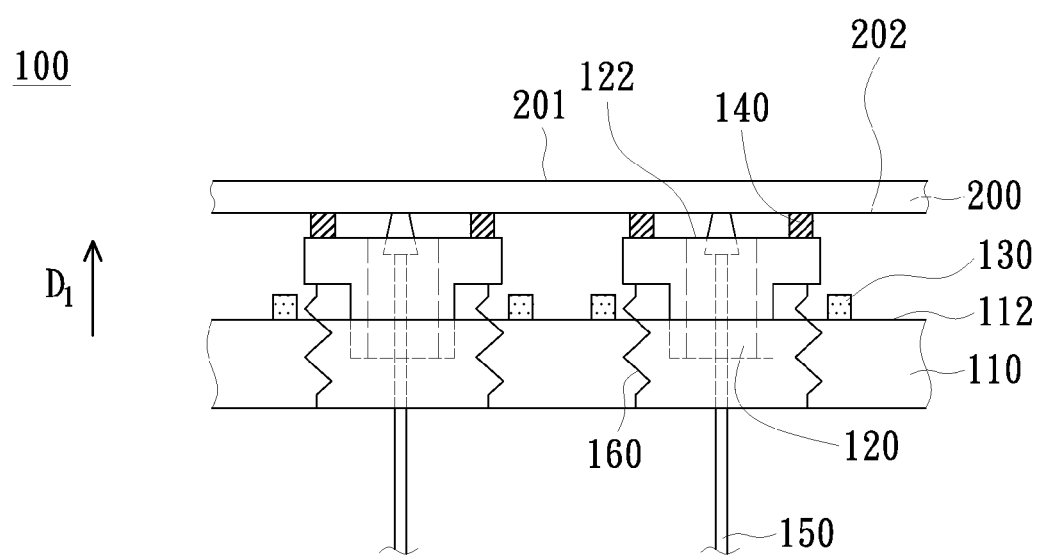

Then, as shown in FIG. 1B, the movable element 120 moves toward a lateral of the holder 110 facing to the substrate 200 to push the substrate 200 such that the first adhesive chucks 130 of the holder 110 are separated from the substrate 200 after the first adhesive chucks 130 and the second adhesive chucks 140 are adhered on the substrate 200. For example, the holder turns over again such that the second surface 202 of the substrate 200 faces downward after the first surface 201 is evaporated the film, and furthering when the holder 110 is movably locked in the chamber, the movable element 120 moves toward the lateral of the holder 110 facing to the substrate 200 along the first axial direction $D_1$ to drive the substrate 200 to jointly move away from the holder 110 along the first axial direction $D_1$ such that the first adhesive chucks 130 of the holder 110 are separated from the substrate 200.

Moreover, the handling device 100 may include a pushing element 150 and the pushing element 150 penetrates through the movable element 120 along the first axial direction $D_1$ to push the substrate 200 away from the holder 110 such that the first adhesive chucks 130 of the holder 110 are separated from the substrate 200. It is noted that the pushing element 150 may drive the movable element 120 to jointly push the substrate 200 away from the holder 110 such that the first adhesive chucks 130 of the holder 110 are separated from the substrate 200 when the pushing element 150 pushes the substrate 200 away from the holder 110.

Figure 1C:
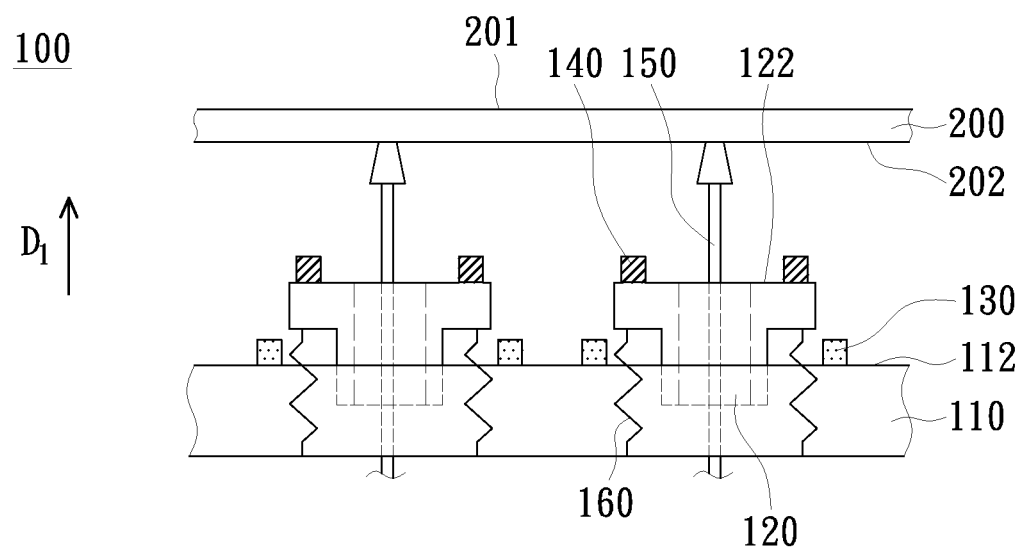

Following, as shown in FIG. 1C, the movable element 120 moves away from the substrate 200 along the first axial direction $D_1$ to drive the second adhesive chucks 140 such that the second adhesive chucks 140 are separated from the substrate 200 after the first adhesive chucks 130 are separated from the substrate 200. For example, the movable element 120 may, but not be limited to, include a recovering element 160 connected to the holder 110. The recovering element 160 may drive the movable element 120 away from the substrate 200 such that the second adhesive chucks 140 are separated from the substrate 200 after the first adhesive chucks 130 are separated from the substrate 200. For instance, when the pushing element 150 pushes the substrate 200 away from the holder 110, the pushing element 150 may drive the movable element 120 to jointly move such that the second adhesive chucks 140 adhered on the substrate 200 move away from the holder 110, thereby resulting in an interval between the movable element 120 and the holder 110 being increased. Owing that the interval between the movable element 120 and the holder 110 are increased to stretch a length of the recovering element 160, a tension of the recovering element 160 is increased. When the tension of the recovering element 160 is larger than the viscosity of the second adhesive chucks 140 adhered on the substrate 200, the tension of the recovering element 160 may cause that he recovering element 160 drives the movable element 120 to jointly move toward the holder 110 such that the second adhesive chucks 140 are separated from the substrate 200. In this embodiment, the recovering element 160 may be an elastic member. Furthering, the recovering element 160 may be, but not limited to, a spring, or may be other element which can provide a pull back force with extending length. In this embodiment, the second adhesive chucks 140 are separated from the substrate 200 after the first adhesive chucks 130 are separated from the substrate 200. That is to say, the substrate 200 only needs a suitable outside force to be respectively separated from the first adhesive chucks 130 and the second adhesive chucks 140 because the first adhesive chucks 130 and the second adhesive chucks 140 can be respectively separated from the substrate 200, and thus the substrate 200 can not be received too large outside force to be damaged. In the other hand, a pushing force of the pushing element 150 only needs to be larger than the viscosity of the second adhesive chucks 140 such that the substrate 200 is separated from the holder 110, and thus the substrate 200 can not be received too large pushing to be damaged.

In another embodiment, when the pushing element 150 pushes the substrate 200 away from the holder 110 and the recovering element 160 reaches the limit of a strengthening length of the recovering element 160, the substrate 200 moves away from the holder 110 to be separated from the second adhesive chucks 140 of the movable element 120 because the movable element 120 is connected to the holder 110 via the recovering element 160 such the movable element 120 is limited to move.

Figure 1D:
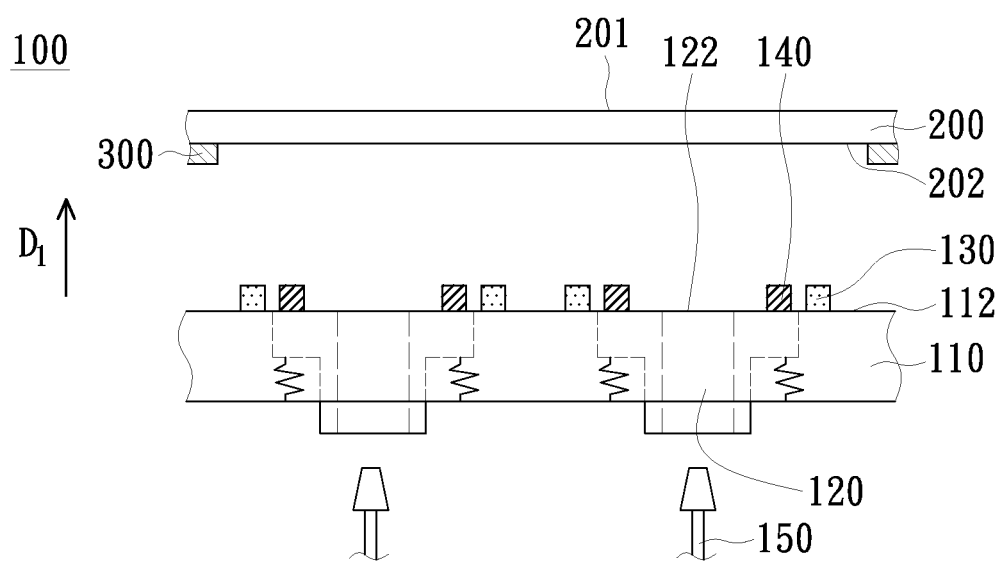

As shown in FIG. 1D, the recovering element 160 drives the movable element 120 to move back to an original position of the embodiment as shown in FIG. 1A owing to the elastic recovery force of the recovering element 160 after the first adhesive chucks 130 and the second adhesive chucks 140 are separated from the substrate. Furthering, a catching element 300 may catch the substrate 200 to transport the substrate 200 to another chamber. In this embodiment, the catching element 300 may be, but not limited to, a robotic arm.

It is noted that the steps of the embodiment as shown in FIG. 1A~1D are processed under a vacuum chamber. In other words, the first adhesive chucks 130 and the second adhesive chucks 140 are adhered on the substrate 200 in the vacuum chamber.

Figure 2:
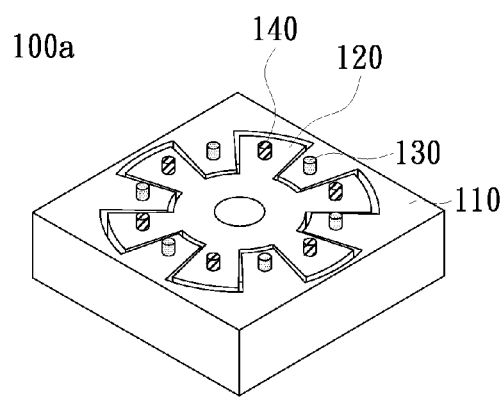
FIG. 2 illustrates a perspective view of a handling device according to another embodiment of the invention.
Figure 3:
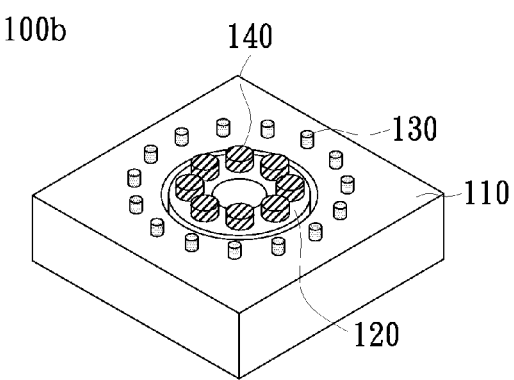
FIG. 3 illustrates a perspective view of a handling device according to another embodiment of the invention.

Referring to FIG. 2 and FIG. 3, FIG. 2 shows a perspective view of a handling device 100a according to another embodiment of the invention and FIG. 3 shows a perspective view of a handling device 100b according to another embodiment of the invention. As shown in FIG. 2, each of the first adhesive chucks 130 and one of the second adhesive chucks 140 are, but not limited to, spaced at an interval. As shown in FIG. 3, a size of each of the first adhesive chucks 130 is different from a size of one of the second adhesive chucks 140. In some embodiment, the size of each of the first adhesive chucks 130 and the size of one of the second adhesive chucks 140 may be the same. It is noted that the size or the arranged way of the first adhesive chucks 130 and the second adhesive chucks 140 are not limited to above embodiments. In addition, the handling device 100a as shown in FIG. 2 and the handling device 100b as shown in FIG. 3 may be applied to the handling method of the embodiment as shown in FIG. 1A~1D and the handling method of the embodiment as shown in FIG. 4A~4D as follows.

FIGS. 4A~4D are flow diagrams showing a handling method in a handling device 400 according to another embodiment of the invention. As shown in FIGS. 4A~4D, the handling device 400 of the embodiment is substantially the same as the handling device 100 of the embodiment as shown in FIGS. 1A~1D. Therefore, there is another embodiment showing the handling method in the handling device 400 as follows.

Figure 4A:
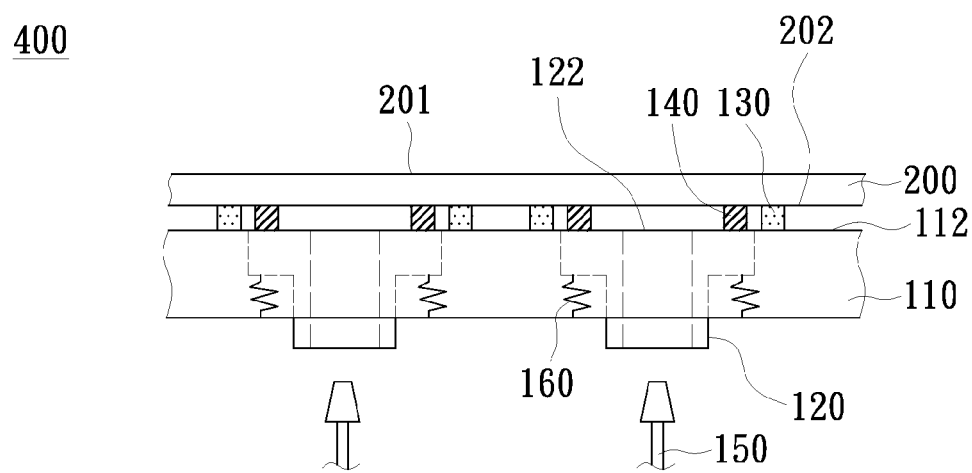
FIGS. 4A~4D are flow diagrams illustrating a handling method in a handling device according to another embodiment of the invention.

As shown in FIG. 4A, the first adhesive chucks 130 located on the first surface 112 of the holder 110 and the second adhesive chucks 140 located on the first surface 122 of the movable element 120 are jointly adhered on the substrate 200. For example, when the substrate 200 is located in a chamber, the holder 110 and the movable element 120 jointly move adjacent to the second surface 202 of the substrate 200 such that the first adhesive chucks 130 and the second adhesive chucks 140 are jointly adhered on a substrate. In another embodiment, the substrate 200 may be transported adjacent to the holder 110 and the movable element 120 by a transporting device (no shown) such that the first adhesive chucks 130 and the second adhesive chucks 140 may be jointly adhered on the substrate 200. The holder 110 and the movable element 120 may jointly drive the substrate 200 to move to the target position or turn over in the target position, in which the substrate 200 may be processed in display panel manufacturing processes in the target position. For instance, when the substrate 200 is processed to be evaporated with a film, the holder 110 turns over such that the second surface 202 of the substrate 200 adhered on the holder 110 faces upward and a first surface 201 of the substrate 200 adhered on the holder 110 faces downward, and thus the first surface 201 facing downward can be evaporated with the film (no shown) thereon. It is noted that the first surface 201 is, but not limited to, opposite to the second surface 202.

Figure 4B:
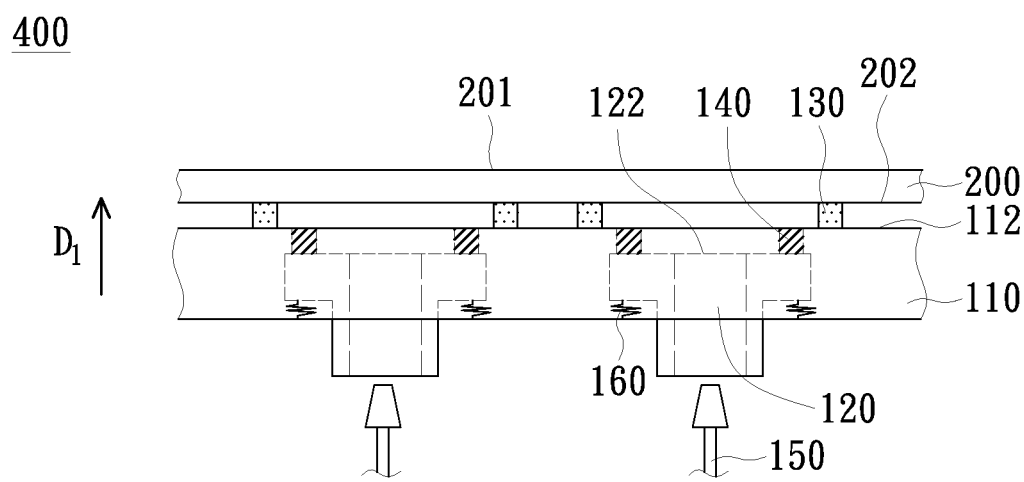

Then, as shown in FIG. 4B, the movable element 120 moves away from the substrate 200 to drive the second adhesive chucks 140 to be separated from the substrate 200 after the first adhesive chucks 130 and the second adhesive chucks 140 are adhered on the substrate 200. For example, after the first surface 201 is evaporated with a film, the holder turns over again such that the second surface 202 of the substrate 200 faces downward. When the holder 110 is locked in the chamber, the movable element 120 moves away from the substrate 200 along the first axial direction $D_1$ such that the second adhesive chucks 140 of the movable element 120 are separated from the substrate 200, in which the first adhesive chucks 130 of the holder 110 are still adhered on the substrate 200.

Figure 4C:
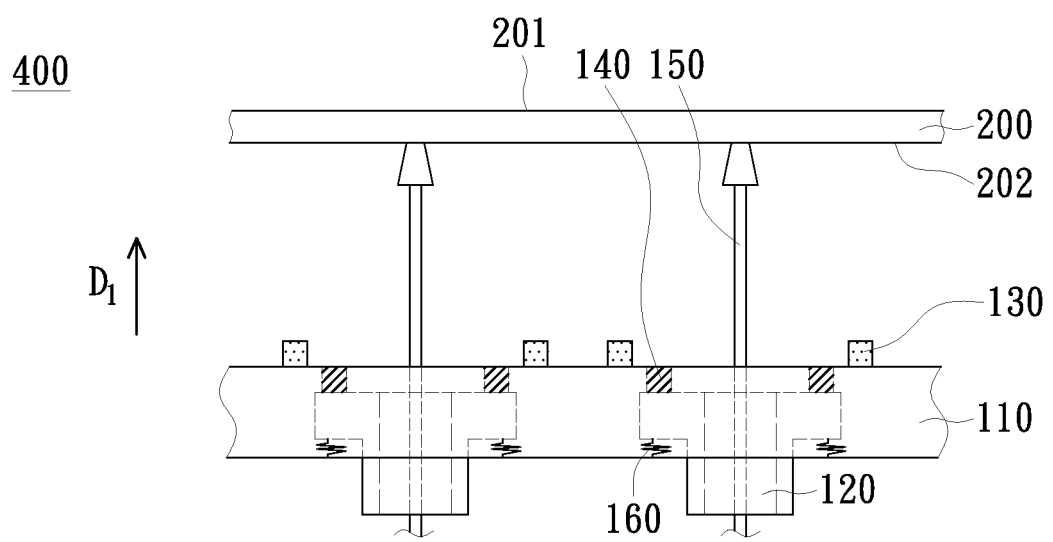

Following, as shown in FIG. 4C, the handling device 100 may include a pushing element 150. The pushing element 150 may be a stick or a stick with a soft leading edge. The pushing element 150 penetrates through the movable element 120 along the first axial direction $D_1$. The pushing element 150 pushes the substrate 200 away from the holder 110 such that the first adhesive chucks 130 of the holder 110 are separated from the substrate 200 after that the second adhesive chucks 140 are separated from the substrate 200. In this embodiment, the first adhesive chucks 130 are separated from the substrate 200 after the second adhesive chucks 140 are separated from the substrate 200. That is to say, the substrate 200 only needs a suitable outside force to be respectively separated from the first adhesive chucks 130 and the second adhesive chucks 140 because the first adhesive chucks 130 and the second adhesive chucks 140 can be respectively separated from the substrate 200, and thus the substrate 200 can not be received too large outside force to be damaged. In the other hand, a pushing force of the pushing element 150 only needs to be larger than the viscosity of the second adhesive chucks 140 such that the substrate 200 is separated from the holder 110, and thus the substrate 200 can not be received too large pushing to be damaged.

Figure 4D:
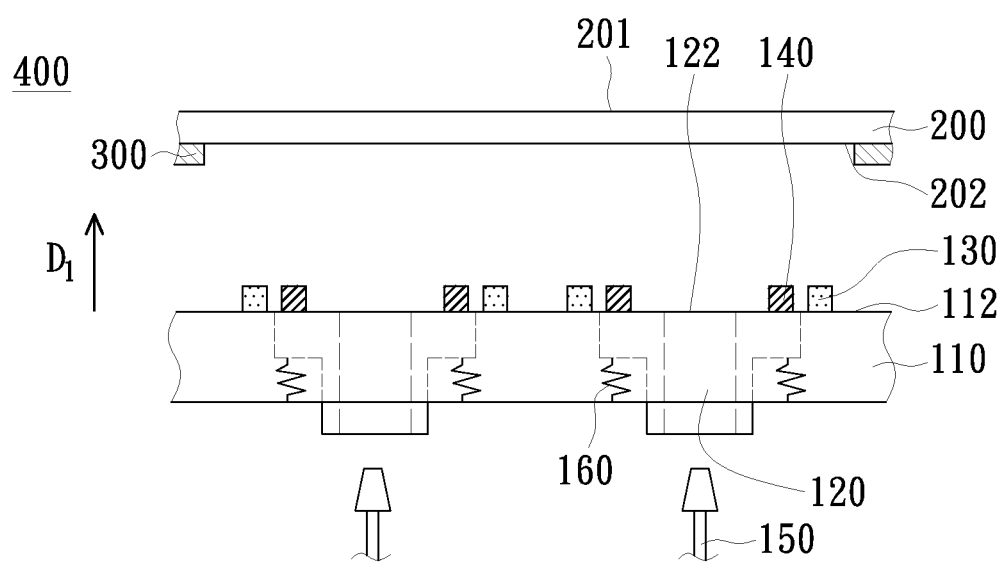

As shown in FIG. 4D, the movable element 120 may, but not be limited to, include a recovering element 160 connected to the holder 110. The recovering element 160 drives the movable element 120 to move toward the lateral of holder 110 facing to the first adhesive chucks 130 after the first adhesive chucks 130 and the second adhesive chucks 140 are separated from the substrate. In other words, the recovering element 160 drives the movable element 120 to move toward the lateral of holder 110 facing to the first adhesive chucks 130 to move back to an original position of the embodiment as shown in FIG. 4A after the first adhesive chucks 130 are separated from the substrate. In this embodiment, the recovering element 160 may be an elastic member. Furthering, the recovering element 160 may be, but not limited to, a spring. The recovering element 160 can drive the movable element 120 to move back to the original position of the embodiment as shown in FIG. 4A owing to the elastic recovery force of the recovering element 160. Furthering, a catching element 300 catches the substrate 200 to transport the substrate 200 to another chamber. In this embodiment, the catching element 300 may be, but not limited to, a robotic arm.

It is noted that the steps of the embodiment as shown in FIG. 4A~4D may be processed under a vacuum chamber. In other words, the first adhesive chucks 130 and the second adhesive chucks 140 may be adhered on the substrate 200 in the vacuum chamber.

According to the embodiments described above, the handling device can be adhered on the substrate or separated form the substrate in the same vacuum chamber to prevent the dust from drifting in the chamber and adhering on the substrate owing to Brownian motion. Simultaneously, the first adhesive chuck and the second adhesive chuck of the handling device can be jointly adhered on the substrate to strengthen the adhering ability of the handling device to reduce the dropping risk when the substrate is transported by the handling device. In addition, the substrate carried by the handling device is capable of being processed in relative manufacturing processes in only one vacuum chamber. Therefore, there is no need of disposing unnecessary chambers for the relative manufacturing processes such that the cost for disposing the chambers and the time for transporting the substrate in the relative manufacturing processes are capable of being decreased, thereby resulting in the manufacturing efficiency of the panel is capable of being simultaneously increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A handling device for handling a substrate, the handling device comprising:
   a holder;
   a movable element located adjacent to the holder for moving relative to the holder along a first axial direction;
   at least one first adhesive chuck located on a first surface of the holder; and
   at least one second adhesive chuck located on a first surface of the movable element, wherein the first adhesive chuck and the second adhesive chuck are configured to be respectively separated from the substrate adhered thereon.

2. The handling device according to claim 1, wherein the movable element is configured for moving away from the holder facing to the substrate such that the first adhesive chuck is separated from the substrate after the first adhesive chuck and the second adhesive chuck are adhered on the substrate, and the movable element is configured for moving away from the substrate to drive the second adhesive chuck such that the second adhesive chuck is separated from the substrate after the first adhesive chuck is separated from the substrate.

3. The handling device according to claim 2, further comprising a pushing element configured to penetrate through the movable element for pushing the substrate away from the holder such that the first adhesive chuck is separated from the substrate.

4. The handling device according to claim 2, wherein the movable element comprises a recovering element connected to the holder and configured for driving the movable element to jointly move toward the holder such that the second adhesive chuck is separated from the substrate after the first adhesive chuck is separated from the substrate.

5. The handling device according to claim 2, wherein a size of the first adhesive chuck is different from a size of the second adhesive chuck.

6. The handling device according to claim 2, wherein the first adhesive chuck and the second adhesive chuck are spaced at an interval.

7. The handling device according to claim 1, wherein the movable element is configured for moving away from the substrate such that the second adhesive chuck is separated from the substrate after the first adhesive chuck and the second adhesive chuck are adhered on the substrate, and the handling device comprises a pushing element configured to penetrating through the movable element for pushing the substrate away from the holder such that the first adhesive chuck is separated from the substrate after the second adhesive chuck is separated from the substrate.

8. The handling device according to claim 7, wherein the movable element comprises a recovering element connected to the holder and configured for driving the movable element to jointly move toward the first adhesive chuck after the first adhesive chuck is separated from the substrate.

9. The handling device according to claim 8, wherein a size of the first adhesive chuck is different from a size of the second adhesive chuck.

10. The handling device according to claim 8, wherein the first adhesive chuck and the second adhesive chuck are spaced at an interval.

11. The handling device according to claim 1, wherein a size of the first adhesive chuck is different from a size of the second adhesive chuck.

12. The handling device according to claim 1, wherein the first adhesive chuck and the second adhesive chuck are spaced at an interval.

13. A handling method, comprising:
adhering a first adhesive chuck located on a first surface of a holder and a second adhesive chuck located on a first surface of a movable element on a substrate; and
respectively separating the first adhesive chuck and the second adhesive chuck from the substrate adhered thereon.

14. The handling method according to claim 13, wherein respectively separating the first adhesive chuck and the second adhesive chuck from the substrate adhered thereon comprises:
handling the movable element to move away from the holder facing to the substrate such that the first adhesive chuck is separated from the substrate after the first adhesive chuck and the second adhesive chuck are adhered on the substrate, and
handling the movable element to move away from the substrate along a first axial direction to drive the second adhesive chuck such that the second adhesive chuck is separated from the substrate after the first adhesive chuck is separated from the substrate.

15. The handling method according to claim 14, further comprising:
handling a pushing element to penetrate through the movable element for pushing the substrate away from the holder such that the first adhesive chuck is separated from the substrate.

16. The handling method according to claim 15, further comprising:
handling a recovering element to drive the movable element to jointly move toward the holder such that the second adhesive chuck is separated from the substrate.

17. The handling method according to claim 13, wherein respectively separating the first adhesive chuck and the second adhesive chuck from the substrate adhered thereon comprises:
handling the movable element to move away from the substrate such that the second adhesive chuck is separated from the substrate after the first adhesive chuck and the second adhesive chuck are adhered on the substrate, and
handling a pushing element penetrating through the movable element to push the substrate away from the holder such that the first adhesive chuck is separated from the substrate.

18. The handling method according to claim 13, further comprising:
handling a recovering element to drive the movable element to jointly move toward the first adhesive chuck after the first adhesive chuck is separated from the substrate.

19. The handling method according to claim 18, wherein respectively separating the first adhesive chuck and the second adhesive chuck from the substrate adhered thereon comprises adhering the first adhesive chuck and the second adhesive chuck on the substrate in a vacuum chamber.

20. The handling method according to claim 13, wherein respectively separating the first adhesive chuck and the second adhesive chuck from the substrate adhered thereon comprises adhering the first adhesive chuck and the second adhesive chuck on the substrate in a vacuum chamber.

* * * * *